(12) United States Patent
Ning

(10) Patent No.: US 12,111,214 B2
(45) Date of Patent: *Oct. 8, 2024

(54) SEMICONDUCTOR DEVICE

(71) Applicant: CHANGXIN MEMORY TECHNOLOGIES, INC., Hefei (CN)

(72) Inventor: Shuliang Ning, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 564 days.

This patent is subject to a terminal disclaimer.

(21) Appl. No.: 17/430,529

(22) PCT Filed: Nov. 11, 2020

(86) PCT No.: PCT/CN2020/128135
§ 371 (c)(1),
(2) Date: Aug. 12, 2021

(87) PCT Pub. No.: WO2022/000927
PCT Pub. Date: Jan. 6, 2022

(65) Prior Publication Data
US 2022/0307908 A1    Sep. 29, 2022

(30) Foreign Application Priority Data

Jun. 30, 2020   (CN) .......................... 202010611253.8

(51) Int. Cl.
*G01K 1/02*    (2021.01)
*G05D 23/19*    (2006.01)
(Continued)

(52) U.S. Cl.
CPC ........... *G01K 1/02* (2013.01); *G05D 23/1917* (2013.01); *G05D 23/2033* (2013.01); *G11C 7/04* (2013.01); *G01K 2219/00* (2013.01)

(58) Field of Classification Search
CPC .. G01K 2219/00; G01K 1/02; G05D 23/1917; G05D 23/2033; G11C 7/04
See application file for complete search history.

(56) References Cited

U.S. PATENT DOCUMENTS 5,351,013 A    9/1994  Alidio et al.
6,453,218 B1   9/2002  Vergis
(Continued)

FOREIGN PATENT DOCUMENTS

CN       1283853 A     2/2001
CN     101017708 A     8/2007
(Continued)

OTHER PUBLICATIONS

Extended European search report for EP application No. 20936097.3, mailed Jul. 15, 2022.
(Continued)

*Primary Examiner* — Mirellys Jagan
(74) *Attorney, Agent, or Firm* — Kilpatrick Townsend & Stockton LLP

(57) ABSTRACT

The present invention provides a semiconductor device comprising a storage chip and a temperature detection module for detecting a temperature of the storage chip. When the temperature detected by the temperature detection module reaches a set threshold, the storage chip is activated. The present invention utilizes the temperature detection module to detect the temperature of the storage chip so as to provide a reference for the activation and operation of the storage chip, avoiding the activation and operation of the storage chip under low temperatures, shortening write time, and improving the stability of the storage chip write; the temperature detection module has a simple circuit structure and is easy for implementation, with a small occupied area, exerting no influence on the active area of the storage chip.

18 Claims, 3 Drawing Sheets

(51) Int. Cl.
 *G05D 23/20* (2006.01)
 *G11C 7/04* (2006.01)

(56) References Cited

U.S. PATENT DOCUMENTS

| | | | |
|---|---|---|---|
| 6,498,577 | B1 | 12/2002 | Lin |
| 7,107,178 | B2 | 9/2006 | Won et al. |
| 7,266,031 | B2 | 9/2007 | Kim et al. |
| 2001/0026576 | A1 | 10/2001 | Beer et al. |
| 2002/0105845 | A1 | 8/2002 | Hidaka |
| 2005/0074051 | A1 | 4/2005 | Won et al. |
| 2005/0105367 | A1 | 5/2005 | Kim et al. |
| 2005/0138513 | A1 | 6/2005 | Mondal et al. |
| 2005/0146965 | A1 | 7/2005 | Kim et al. |
| 2005/0185491 | A1 | 8/2005 | Kim et al. |
| 2006/0221741 | A1 | 10/2006 | Jain et al. |
| 2007/0171956 | A1 | 7/2007 | Noguchi |
| 2007/0247944 | A1 | 10/2007 | Fischer et al. |
| 2008/0018483 | A1 | 1/2008 | Kang |
| 2008/0019198 | A1 | 1/2008 | Co et al. |
| 2008/0068873 | A1 | 3/2008 | Matsuno et al. |
| 2008/0091378 | A1 | 4/2008 | Jeong et al. |
| 2008/0106928 | A1 | 5/2008 | Happ et al. |
| 2008/0247252 | A1 | 10/2008 | Ruf et al. |
| 2009/0014433 | A1 | 1/2009 | O'Neil et al. |
| 2009/0085647 | A1 | 4/2009 | Hwang |
| 2010/0169551 | A1 | 7/2010 | Yano et al. |
| 2011/0279168 | A1 | 11/2011 | Lee et al. |
| 2012/0163413 | A1 | 6/2012 | Kim et al. |
| 2013/0057246 | A1 | 3/2013 | Satoh et al. |
| 2013/0114364 | A1 | 5/2013 | Sakakibara et al. |
| 2013/0235689 | A1 | 9/2013 | Koyama |
| 2013/0292847 | A1 | 11/2013 | Choi et al. |
| 2014/0140156 | A1 | 5/2014 | Shoemaker et al. |
| 2015/0043266 | A1 | 2/2015 | Youn |
| 2015/0355034 | A1 | 12/2015 | Cho et al. |
| 2016/0064063 | A1* | 3/2016 | Nomura ............ G11C 11/40618 365/189.011 |
| 2016/0211215 | A1 | 7/2016 | Lee et al. |
| 2017/0071056 | A1* | 3/2017 | Stoev ................ G11C 7/04 |
| 2017/0227405 | A1 | 8/2017 | Bousquet et al. |
| 2017/0249091 | A1 | 8/2017 | Hodes et al. |
| 2017/0262198 | A1 | 9/2017 | Nakata et al. |
| 2018/0166123 | A1 | 6/2018 | Goto et al. |
| 2018/0293029 | A1 | 10/2018 | Achtenberg et al. |
| 2018/0315483 | A1 | 11/2018 | Yang et al. |
| 2019/0096473 | A1 | 3/2019 | Park |
| 2019/0348083 | A1 | 11/2019 | Pao |
| 2021/0247241 | A1 | 8/2021 | Nagata |
| 2022/0006427 | A1 | 1/2022 | Sugimoto |

FOREIGN PATENT DOCUMENTS

| | | | | |
|---|---|---|---|---|
| CN | 101162604 | A | 4/2008 | |
| CN | 102353477 | A | 2/2012 | |
| CN | 102543941 | A | 7/2012 | |
| CN | 104115227 | A | 10/2014 | |
| CN | 104637524 | A | 5/2015 | |
| CN | 104807561 | A | 7/2015 | |
| CN | 105280608 | A | 1/2016 | |
| CN | 105390481 | A * | 3/2016 | ....... G11C 11/40618 |
| CN | 105474543 | A | 4/2016 | |
| CN | 106816430 | A | 6/2017 | |
| CN | 206559408 | U | 10/2017 | |
| CN | 107706179 | A | 2/2018 | |
| CN | 107764431 | A | 3/2018 | |
| CN | 109547025 | A | 3/2019 | |
| CN | 208953151 | U | 6/2019 | |
| CN | 110211953 | A | 9/2019 | |
| CN | 110299171 | A | 10/2019 | |
| CN | 110687740 | A | 1/2020 | |
| CN | 110718502 | A | 1/2020 | |
| CN | 210626994 | U | 5/2020 | |
| CN | 210742762 | U | 6/2020 | |
| CN | 211507637 | U | 9/2020 | |
| CN | 212303077 | U | 1/2021 | |
| CN | 212303078 | U | 1/2021 | |
| CN | 212303079 | U | 1/2021 | |
| EP | 4174461 | A1 | 5/2023 | |
| JP | 2007047177 | A | 2/2007 | |
| JP | 2007192718 | A | 8/2007 | |
| JP | 2008032497 | A | 2/2008 | |
| JP | 2009170605 | A | 7/2009 | |
| JP | 2009188016 | A | 8/2009 | |
| JP | 2011052980 | A | 3/2011 | |

OTHER PUBLICATIONS

ISR for International Application PCT/CN2020/128135 issued Mar. 2, 2021.
ISR for International Application PCT/CN2020/128132, mailed Mar. 31, 2021, 4 pages.
SR for International Application PCT/CN2020/128136, mailed Mar. 31, 2021, 4 pages.
Office Action and search report issued in the corresponding Chinese application No. 202010611253.8, mailed Apr. 29, 2022, 10 pages.
Extended European Search Report for EP application No. 20940477.1, dated Dec. 14, 2023.
State Intellectual Property Office of the People's Republic of China, First Office Action and search report Issued in Application No. 202010611284.3, Jun. 1, 2023, 10 pages.
United States Patent and Trademark office, Non-Final office action issued in U.S. Appl. No. 17/376,090 on Jul. 11, 2023, 13 pages.
European Patent Office, Extended European Search Report Issued in Application No. 20943341.6, Jun. 27, 2023, Germany, 7 pages.
United States Patent and Trademark office, Non-Final office action issued in U.S. Appl. No. 17/389,654 on Aug. 2, 2023, 14 pages.
State Intellectual Property Office of the People's Republic of China, First Office Action and search report Issued in Application No. 202010673713.X, Jul. 6, 2022, 8 pages.
European Patent Office, office action Issued in Application No. 22730660.2, Feb. 26, 2024, Netherlands, 6 pages.
European Patent Office, Extended European Search Report Issued in Application No. 20945120.2, Jul. 21, 2023, Germany, 8 pages.
United States Patent and Trademark office, Non-Final office action issued in U.S. Appl. No. 17/389,629 on Apr. 22, 2022, 12 pages.
ISA State Intellectual Property Office of the People's Republic of China, international search report Issued in Application No. PCT/CN2020/136388, Apr. 8, 2021, WIPO, 4 pages.
Japanese Patent Office, first office action Issued in Application No. 2022-553651, Oct. 3, 2023, 6 pages.
Korean Intellectual Property Office, First Office Action Issued in Application No. 10-2022-7033535, May 29, 2024, 12 pages.
State Intellectual Property Office of the People's Republic of China, Office Action and Search Report Issued in Application No. 202010689669.1, Jul. 25, 2024, 7 pages.

* cited by examiner

SEMICONDUCTOR DEVICE

CROSS-REFERENCE TO RELATED APPLICATIONS

The present application is a national phase entry of International Patent Application No. PCT/CN2020/128135, filed on Nov. 11, 2020, which claims the priority of Chinese Patent Application No. 202010611253.8, filed on 30 Jun. 2020. The disclosures of the aforementioned patent applications are incorporated by reference in their entirety.

TECHNICAL FIELD

The present invention relates to the field of memory, in particular to a semiconductor device.

BACKGROUND

Dynamic Random Access Memory (DRAM) is a semiconductor storage device commonly used in computers, and its storage array region consists of many repeating storage cells. Each of the storage cells typically includes a capacitor and a transistor, wherein the gate of the transistor is connected to a word line, the drain is connected to a bit line, and the source electrode is connected to the capacitor. The voltage signal over the word line can control ON/OFF of the transistor, and then data information stored in the capacitor is read through the bit line, or data information is written through the bit line to the capacitor for storage.

Temperature has a great effect on memory write. In low temperature environments, in the case of writing to memory, there are problems of long writing time and low writing stability.

SUMMARY

The technical problem to be solved by the present invention is to provide a semiconductor device capable of avoiding the activation and operation of a storage chip under low temperatures, shortening write time, and improving the writing stability of the storage chip.

In order to realize the above problem, the present invention provides a semiconductor device that includes a storage chip and a temperature detection module for detecting the temperature of the storage chip. When the temperature detected by the temperature detection module reaches a set threshold, the storage chip is activated. The temperature detection module includes: a temperature detection unit for detecting a temperature of the storage chip and outputting an analogue signal corresponding to the temperature; an A/D conversion module having an input terminal and an output terminal, wherein the input terminal receives the analogue signal output by the temperature detection unit, the output terminal outputs a digital signal, and the A/D conversion module is configured to convert the analogue signal output by the temperature detection unit to the digital signal.

Further, the temperature detection unit and the storage chip are powered by different power supplies.

Further, the power supplied to the temperature detection unit is earlier than the power supplied to the storage chip.

Further, the temperature detection unit includes: a fixed resistor having a first terminal and a second terminal, wherein the first terminal is electrically connected to the power supply; a diode connected in series with the fixed resistor, wherein a positive terminal of the diode is connected to the second terminal of the fixed resistor, and a negative terminal of the diode is electrically connected to a grounding terminal.

Further, the temperature detection unit further includes a variable resistor connected in parallel with the diode.

Further, the A/D conversion module includes: a resistance unit having a first terminal and a second terminal, wherein the first terminal of the resistance unit is electrically connected to the power supply, the second terminal of the resistance unit is electrically connected to a grounding terminal, and the resistance unit has a plurality of leading-out terminals, each of which has a different voltage; a plurality of comparing units, wherein a signal of the input terminal of the A/D conversion module is used as an input signal of the comparing units, signals of the plurality of leading-out terminals of the resistance unit are used as reference signals of the plurality of the comparing units respectively, and the comparing units output digital signals.

Further, the A/D conversion module further includes an encoding unit receiving and encoding the digital signals output by the comparing units.

Further, the resistance unit includes a plurality of sub-resistors connected in series, wherein the quantity of the sub-resistors spaced between each of the leading-out terminals of the resistance unit and the second terminal of the resistance unit is different such that each of the leading-out terminals has a different voltage.

Further, resistance values of the sub-resistors are either same or different.

Further, the quantity of the sub-resistors spaced between each of the leading-out terminals of the resistance unit and the second terminal of the resistance unit increments by a preset numerical value.

Further, the A/D conversion module further includes an output unit connected to the comparing units and configured to output the digital signals.

Further, the temperature detection unit is disposed in the storage chip.

Further, the A/D conversion module is disposed in the storage chip.

Further, the temperature detection unit and the storage chip share the same grounding terminal.

Further, one or more storage chips are provided, and in the case of a plurality of the storage chips, several of the storage chips are sequentially stacked upwardly.

Further, in the case of a plurality of the storage chips, the storage chips are electrically connected to the grounding terminal and the power supply with a through-silicon-via structure.

Further, the temperature detection unit is electrically connected to the power supply with a through-silicon-via structure.

Further, one or more temperature detection units are provided, and the temperature detection unit is one-to-one corresponding to the storage chip.

Further, the semiconductor device further includes a control chip, wherein the storage chip and the temperature detection unit are electrically connected to the control chip.

Further, the storage chip is disposed on the control chip.

Further, the semiconductor device further includes a wiring substrate having connection lines provided therein, wherein both of the storage chip and the control chip are located on the wiring substrate, and the storage chip and the control chip are electrically connected through the connection lines in the wiring substrate.

Further, the control chip is configured to heat the storage chip prior to the activation of the storage chip, and to judge whether a temperature detected by the temperature detection unit reaches a set threshold, and to control the activation of the storage chip if the set threshold is reached.

The advantage of the present invention is as follows. A temperature detection module is utilized to detect the temperature of a storage chip, and when the temperature detected by the temperature detection module reaches a set threshold, the storage chip is activated; the temperature detected by the temperature detection module provides a reference for the activation and operation of the storage chip, thereby avoiding the activation and operation of the storage chip under low temperatures, shortening write time, and improving the stability of the storage chip write. Additionally, the temperature detection module according to the present invention has a simple circuit structure and is easy for implementation, with a small occupied area, exerting no influence on the active area of the storage chip.

DESCRIPTION OF EMBODIMENTS

Embodiments of the semiconductor device of the present invention are detailed below in combination with drawings.

As described in the background of the invention, temperature has a great effect on memory write, and in low temperature environments, in the case of writing to memory, there are problems of long writing time and low writing stability.

Studies find out that, when existing memory operates in low temperature environments, the stability of memory write is affected since a temperature drop may cause increased resistances of the word line, bit line, metal connecting line (metal contacting portion), or the like in the memory, and the increased resistances may cause varied or extended time when data is written into memory.

Therefore, the present invention provides a semiconductor device with a temperature detection module to detect the temperature of the storage chip so as to provide a reference for the activation and operation of the storage chip, thereby avoiding the activation and operation of the storage chip under low temperatures, shortening write time, and improving the writing stability of the storage chip.

Figure 1:
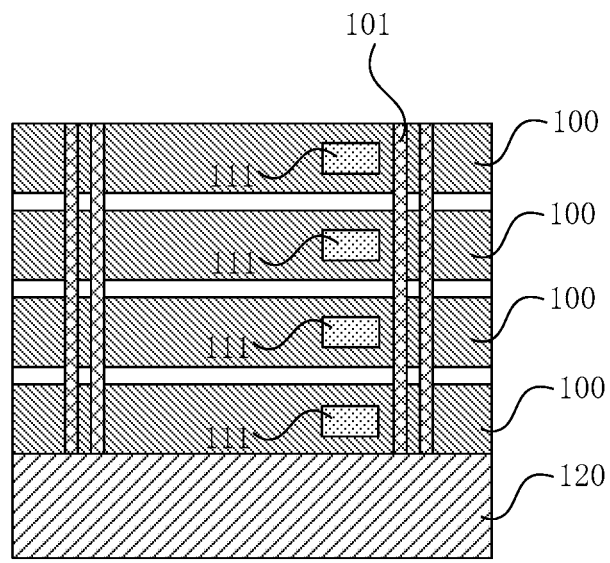
FIG. 1 is a schematic structural diagram of a first embodiment of a semiconductor device according to the present invention.
Figure 2A:
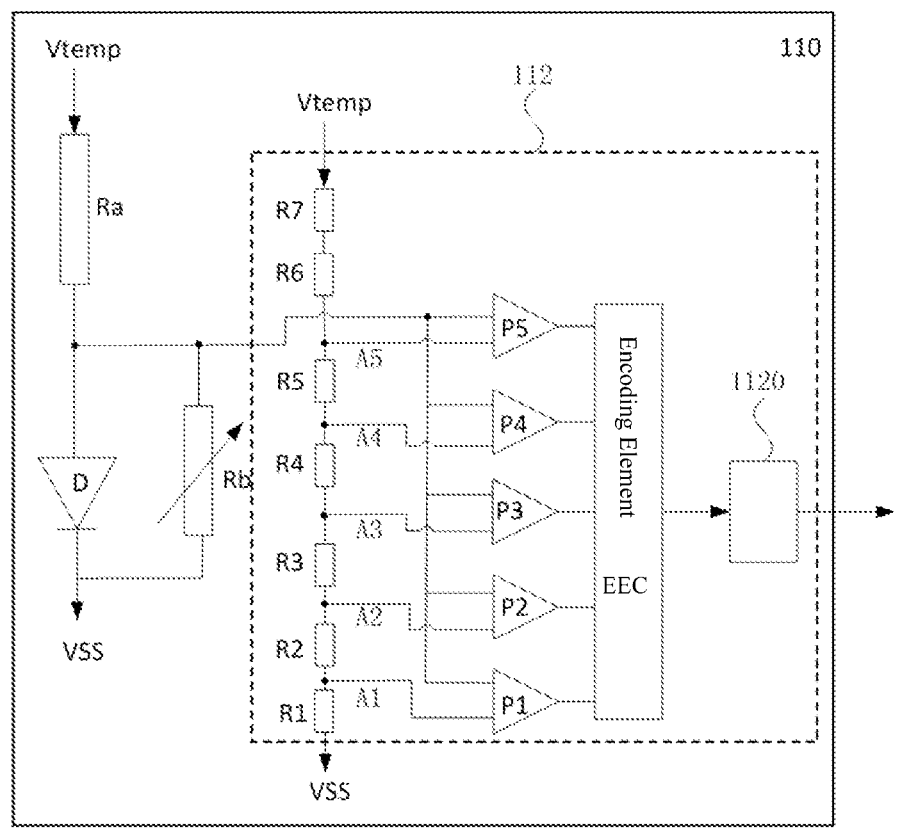
FIG. 2A is a circuit diagram of a temperature detection module in the semiconductor device according to the present invention.

FIG. 1 is a schematic structural diagram of the first embodiment of the semiconductor device according to the present invention, and FIG. 2A is a circuit diagram of the temperature detection module in the semiconductor device according to the present invention. Referring to FIGS. 1 and 2A, the semiconductor device according to the present invention includes a storage chip 100 and a temperature detection module 110.

The semiconductor device further includes a control chip 120, wherein the storage chip 100 and the temperature detection module 110 are electrically connected to the control chip 120. The control chip 120 is configured to control the activation and operation of the storage chip 100 and the temperature detection module 110. The activation of the storage chip 100 includes power up and self-check, and the operation of the storage chip 100 includes writing data to the storage chip 100, reading data from the storage chip 100, and deleting the accessed data in the storage chip 100, or the like.

The storage chip 100 is an existing memory capable of performing data write, data read, and/or data deletion. The storage chip 100 is formed by the semiconductor integration fabricating process. Specifically, the storage chip 100 can include a storage array and peripheral circuits connected to the storage array. The storage array includes a plurality of storage cells and bit lines, word lines, and metal connecting lines (metal contacting portions) that are connected to the storage cells. The storage cells are configured to store data, and the peripheral circuits are related circuits when operations are performed on the storage arrays. In the present embodiment, the storage chip 100 is a DRAM storage chip, which includes a plurality of storage cells. The storage cell includes a capacitor and a transistor. The gate of the transistor is connected to a word line, the drain is connected to a bit line, and the source electrode is connected to the capacitor. In other embodiments, as the storage chip 100, other types of storage chips may be used.

The temperature detection module 110 is configured to detect the temperature of the storage chip 100, and to provide the signal for the control chip 120. When a temperature detected by the temperature detection module 110 reaches a set threshold, the control chip 120 controls the activation of the storage chip 100. The specific magnitude of the set threshold may be set as needed or based on experience.

The temperature detection module 110 includes a temperature detection unit 111 and an A/D conversion module 112.

The temperature detection unit 111 is configured to detect the temperature of the storage chip 100, and to output an analogue signal corresponding to the temperature. The A/D conversion module 112 is configured to convert the analogue signal output by the temperature detection unit 111 to a digital signal, which is provided for the control chip 120 as the reference signal for judging whether to activate the storage chip 100. The A/D conversion module 112 has an input terminal and an output terminal, and the input terminal receives the analogue signal output by the temperature detection unit 111, and the output terminal outputs a digital signal.

The semiconductor device includes one or more storage chips 100, and the temperature detection module 110 includes one or more temperature detection units 111. The temperature detection unit 111 may be configured to detect the temperature(s) of one or more storage chips 100. The temperature detection unit 111 may be in one-to-one relationship or one-to-many relationship with the storage chip 100.

When the number of the storage chip 100 is one, and the number of the temperature detection unit 111 is also one, the temperature detection unit 111 is in one-to-one relationship with the storage chip 100 and configured to merely detect the temperature of this storage chip 100.

When the number of the storage chip 100 is more than one, and the number of the temperature detection unit 111 is one, the temperature detection unit 111 is in one-to-many relationship with the storage chip 100 and configured to detect the temperatures of the more than one storage chips 100.

When the number of the storage chip 100 is more than one, and the number of the temperature detection unit 111 is also more than one, but the number of the temperature detection unit 111 is less than the number of the storage chip 100, the temperature detection unit 111 and the storage chip 100 may have one-to-one relationship and one-to-many relationship simultaneously, or have one-to-many relationship only. That is, there may be the situation where one of the temperature detection units 111 detects one storage chip 100 only and one temperature detection unit 110 detects more than one of the storage chips 100, or only the situation where one temperature detection unit 110 detects more than one of the storage chips 100.

When the number of the storage chip 100 is more than one, and the number of the temperature detection unit 111 is also more than one, and the number of the temperature detection unit 100 equals to the number of the storage chip 100, the temperature detection unit 111 is in one-to-one relationship with the storage chip 100, and one temperature detection unit 111 is configured to detect the temperature of one of the storage chips 100. Specifically, in the present embodiment, the number of the storage chip 100 is more than one, and the number of the temperature detection unit 111 is also more than one. As shown in FIG. 1, four storage chips 100 and four temperature detection units 111 are schematically depicted in FIG. 1. The plurality of the storage chips 100 are disposed as a stack and the temperature detection units 111 are one-to-one corresponding to the storage chips 100.

Further, referring to FIG. 2A continuously, in the present invention, the temperature detection unit 111 includes a fixed resistor Ra and a diode D. The fixed resistor Ra has a first terminal and a second terminal, and the first terminal is electrically connected to the power supply Vtemp. The diode D is connected in series with the fixed resistor Ra. The positive terminal of the diode D is connected to the second terminal of the fixed resistor Ra, and the negative terminal of the diode D is electrically connected to the grounding terminal VSS. The diode D is sensitive to temperature, and its current changes as the change in temperature of its ambient environment, and then can be used to measure the temperature of the ambient environment.

Further, in the present embodiment, the temperature detection unit 111 further includes a variable resistor Rb, which is connected in parallel with the diode D and configured to calibrate the diode D. The resistance value of the variable resistor Rb may vary. For example, the resistance value of the variable resistor Rb is varied by the control performed by the control chip 120, thereby enabling the calibration of the diode D.

Further, the temperature detection unit 111 may be formed in the storage chip 100 through the semiconductor integration fabricating process. In the case of merely detecting the temperature of one storage chip 100, the temperature detection unit 111 may be formed in this storage chip 100. For example, in the present embodiment, as shown in FIG. 1, the temperature detection units 111 are one-to-one corresponding to the storage chips 100, and each storage chip 100 is provided with one temperature detection unit 111 therein. In the case of detecting the temperatures of a plurality of the storage chips 100, the temperature detection unit 111 may be formed in any one of the plurality of the storage chips 100 or in the storage chip 100 at the centered or bottommost layer. For example, in the second embodiment of the present invention, referring to FIG. 3 which is a schematic structural diagram of the second embodiment of the semiconductor device according to the present invention, the temperature detection unit 111 is disposed in the storage chip 100 at the bottommost layer and capable of measuring the temperatures of four storage chips 100.

In another embodiment of the present invention, the temperature detection unit 111 is disposed in the control chip 120 rather than a storage chip 100. Specifically, referring to FIG. 4 which is a schematic structural diagram of the third embodiment of the semiconductor device according to the present invention, the temperature detection unit 111 is disposed in the control chip 120 and capable of measuring the temperatures of four storage chips 100 stacked on the control chip 120.

Figure 3:
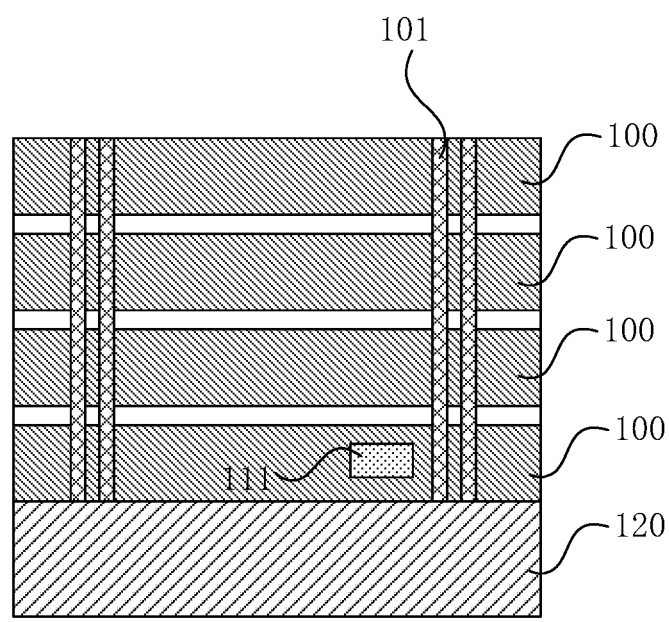
FIG. 3 is a schematic structural diagram of a second embodiment of the semiconductor device according to the present invention.
Figure 4:
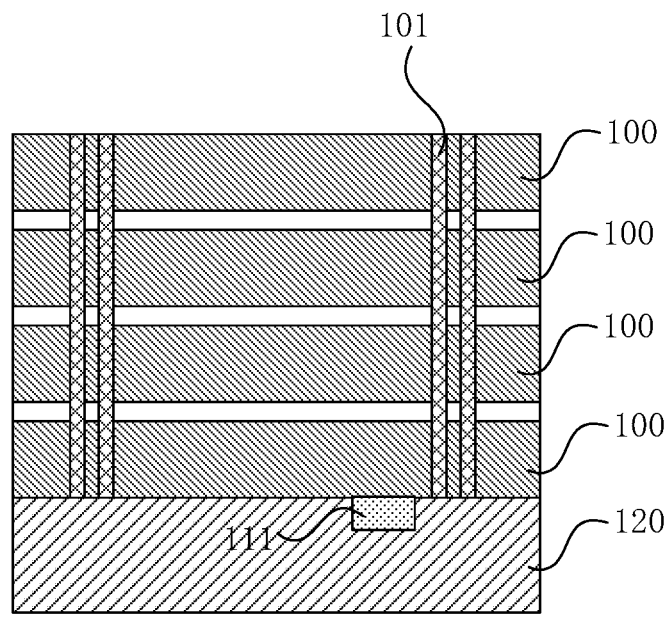
FIG. 4 is a schematic structural diagram of a third embodiment of the semiconductor device according to the present invention.
Figure 5:
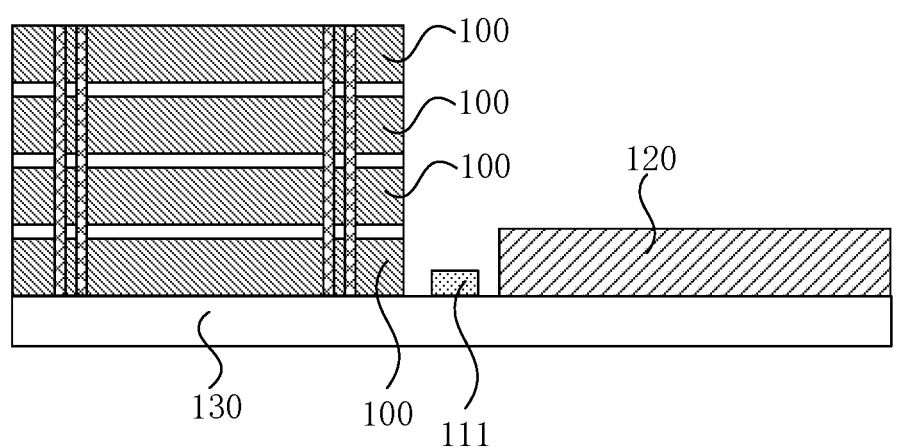
FIG. 5 is a schematic structural diagram of a fourth embodiment of the semiconductor device according to the present invention.

In another embodiment of the present invention, referring to FIG. 5 which is a schematic structural diagram of the fourth embodiment of the semiconductor device according to the present invention, the semiconductor device further includes a wiring substrate 130 having connection lines (not depicted in the figure) provided therein, wherein both of the storage chip 100 and the control chip 120 are located on the wiring substrate 130, and the storage chip 100 and the control chip 120 are electrically connected through the connection lines in the wiring substrate 130. In this embodiment, the temperature detection unit 111 is also disposed on the wiring substrate 130 and configured to measure the ambient temperature. This ambient temperature is close to the temperature of the storage chip 100 and may be approximately as the temperature of the storage chip 100. The wiring substrate 130 includes, but not limited to, a PCB circuit board. It can be understood that, in other embodiments of the present invention, the temperature detection unit 111 may not be disposed on the wiring substrate 130, and is disposed in the storage chip 100 or the control chip 120, as shown in FIGS. 1, 3 and 4.

It should be noted that, the functions of the control chip 120 in the present embodiment, namely, the functions regarding the control of the activation of the storage chip 100, or the like, can also be implemented by providing a control circuit in the storage chip 100. At this point, the presence of the control chip 120 may not be required, and as should be appreciated by the person skilled in the art, it may be provided voluntarily as needed.

Figure 2B:
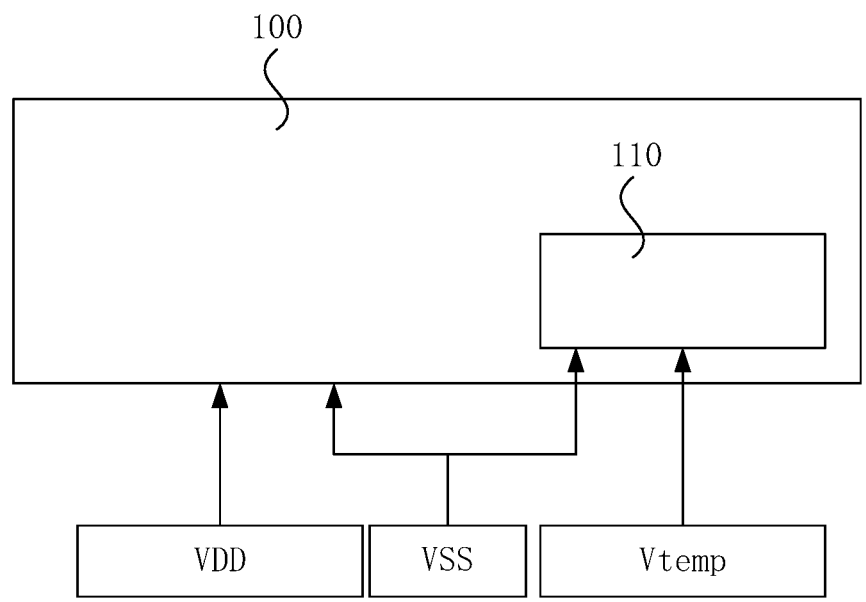
FIG. 2B is a schematic diagram of the electric connections of the first embodiment of the semiconductor device according to the present invention.

Further, the temperature detection units 111 and the storage chips 100 are powered by different power supplies. FIG. 2B is a schematic diagram of the electric connections of the first embodiment of the semiconductor device according to the present invention. Referring to FIG. 2B, the temperature detection unit 111 is powered by using a power supply Vtemp, and the storage chip 100 is powered by using VDD. The grounding terminal VSS, the power supply VDD and the power supply Vtemp are provided by the control chip 120. Since the temperature detection unit 111 and the storage chip 100 are powered by using different power supplies, the power supplied to the temperature detection unit 111 and the power supplied to the storage chip 100 can be controlled independently, thereby enabling the temperature detection unit 111 to be activated at a different time from the storage chip 100.

The present invention can control the activation of the temperature detection unit 111 and the activation of the storage chip 100 separately, i.e., the activation of the temperature detection unit 111 is free from whether a storage chip 100 is activated, so that the detection of the temperature of the storage chip 100 is not affected by whether a storage chip 100 is activated, thereby providing a reference for the activation and operation of the storage chip 100, and in turn avoiding the activation or operation of the storage chip 100 under low temperatures and improving the stability of the storage chip 100.

As described above, temperature has a great influence on the performance of the storage chip 100, especially when the storage chip 100 is activated. If the storage chip 100 is activated under low temperatures, the time of writing data into the storage chip 100 may vary (e.g., extend), affecting the stability of the storage chip 100. Therefore, the temperature of the storage chip is required to be measured before the activation of the storage chip 100 such that the storage chip 100 can be activated within a suitable temperature.

Therefore, in the present invention, the power supplied to the temperature detection unit 111 is earlier than the power supplied to the storage chip 100, i.e., before the storage chip 100 is activated, the temperature detection unit 111 has been activated, and thus, the temperature prior to the activation of the storage chip 100 can be acquired so as to provide a reference for the activation of the storage chip 100. The difference between the time when power is supplied to the temperature detection unit 111 and the time when power is supplied to the storage chip 100 depends on the rate of change in the temperature of the storage chip 100. If the rate of change in the temperature of the storage chip 100 is large, and the time during which the storage chip 100 reaches a preset temperature is short, then there exists a small difference between the time when power is supplied to the temperature detection unit 111 and the time when power is supplied to the storage chip 100. If the rate of change in the temperature of the storage chip 100 is small, and the time during which the storage chip 100 reaches the preset temperature is long, then there exists a great difference between the time when power is supplied to the temperature detection unit 111 and the time when power is supplied to the storage chip 100.

Further, referring to FIG. 2B, the temperature detection unit 111 and the storage chip 100 share the same grounding terminal VSS. The advantage thereof is as follows. On one hand, the leakage current of the non-activated phase of the storage chip 100 will not increase, and on the other hand, the number of the pins will reduce, thereby saving space.

Referring to FIG. 1 continuously, a plurality of storage chips 100 are stacked on the control chip 120, which bonds with the storage chip 100 at the bottommost layer of the stack structure. However, in another embodiment of the present invention, when only one storage chip 100 is provided, this storage chip 100 is disposed on and bonds with the control chip 120.

The storage chip 100 has a through-silicon-via interconnecting structure 101 formed therein. With the through-silicon-via interconnecting structure 101, the storage chip 100 is electrically connected to the control chip 120, and the temperature detection unit 111 is electrically connected to the control chip 120. That is, with the through-silicon-via interconnecting structure 101, the storage chip 100 is electrically connected to the grounding terminal VSS and the power supply VDD, and the temperature detection unit 111 is electrically connected to the power supply Vtemp and the grounding terminal VSS. Specifically, in the present embodiment, when the plurality of the storage chips 100 are stacked, each of the storage chips 100 may be connected to the control chip 120 through different through-silicon-via interconnecting structures; when a plurality of the temperature detection units 111 is provided, there may be the situation where each of the temperature detection units 111 is connected to the control chip 120 through through-silicon-via interconnecting structures, and also the situation where the plurality of the temperature detection units 111 share the through-silicon-via interconnecting structure so as to connect to the control chip 120. It can be understood that the storage chip 100 and the temperature detection units 111 are connected to the control chip 120 through different through-silicon-via interconnecting structures such that the temperature detection units 111 and the storage chip 100 can be powered by different power supplies. Further, the power supplying of the plurality of the temperature detection units 111 may also share the technology of through-silicon-via interconnecting structure.

In other embodiments, the storage chip 100 and the temperature detection unit may also electrically connect to the control chip 120 by using metal leads (formed by the lead bonding process).

Further, the A/D conversion module 112 includes a resistance unit and a plurality of comparing units Px.

The resistance unit has a first terminal and a second terminal. The first terminal of the resistance unit is electrically connected to a power supply. The resistance unit and the temperature detection unit 111 may use either the same power supply or different power supplies. For example, if the A/D conversion module 112 is disposed in the storage chip 100, then the first terminal of the resistance unit and the temperature detection unit 111 may use the same power supply Vtemp; if the A/D conversion module 112 is disposed in the control chip 120, then the first terminal of the resistance unit and the temperature detection unit 111 may use different power supplies, and the resistance unit may use the power supply VDD. The second terminal of the resistance unit is electrically connected to the grounding terminal VSS. The resistance unit has a plurality of leading-out terminals Ax, each of which has a different voltage.

In the present embodiment, the resistance unit includes a plurality of sub-resistors Rxs connected in series, wherein the quantity of the sub-resistors Rxs spaced between each leading-out terminal Ax of the resistance unit and the second terminal of the resistance unit is different such that each leading-out terminal Ax has a different voltage. For example, the leading-out terminal A1 is spaced from the second terminal of the resistance unit by a sub-resistor R1, and the leading-out terminal A2 is spaced from the second terminal of the resistance unit by sub-resistors R1 and R2, and thus, the leading-out terminal A1 and the leading-out terminal A2 have different voltages.

The quantity of the sub-resistors Rxs spaced between each leading-out terminal Ax of the resistance unit and the second terminal of the resistance unit increments by a preset numerical value. The preset numerical value may be either a constant value or a variable value.

Referring to FIG. 2A, the quantity of the sub-resistors Rxs spaced between each leading-out terminal Ax of the resistance unit and the second terminal of the resistance unit increments by a constant value of 1 in the present embodiment. However, in other embodiments of the present invention, it may also increment by a constant value of 2, or the like.

In the case of a variable value, the preset numerical value has a variation trend.

Further, the resistance values of the sub-resistors Rxs are either same or different such that the variations of increasing ranges between the voltages of the leading-out terminals Axs are either consistent or inconsistent. If the resistance values of the sub-resistors Rxs are the same, then the difficulty of the layout arrangement can be reduced, and it is simple and easy to practice and convenient for fabrication.

The signal of the input terminal of the A/D conversion module is used as the input signal of the comparing units Pxs, i.e., the analogue signal output by temperature detection unit is used as the input signal of the comparing units Pxs. The signals of the plurality of the leading-out terminals Axs of the resistance unit are used as the reference signals of the plurality of the comparing units Pxs. The leading-out terminals Axs are one-to-one corresponding to the comparing units Pxs. For example, the signal of the leading-out terminal A1 is used as the reference signal of the comparing unit P1, the signal of the leading-out terminal A2 is used as the reference signal of the comparing unit P2, and the like. The leading-out terminals Axs are one-to-one corresponding to the comparing units Pxs. The comparing unit Px outputs a digital signal. The temperature of the storage chip 100 detected by the temperature detection unit 111 can be obtained based on the digital signal output by the comparing unit Px.

Further, the A/D conversion module 112 further includes an output unit 1120 connected to the comparing units Pxs and configured to output the digital signals. Further, in the present embodiment, the A/D conversion module 112 further includes an encoding unit EEC, which receives and encodes the digital signal output by the comparing unit Px, and the signal formed thereby is input to the output unit 1120, and the output unit 1120 outputs the encoded digital signal.

The semiconductor device according to the present invention utilizes a temperature detection module to detect the temperature of a storage chip, and when the temperature detected by the temperature detection module reaches a set threshold, or after the temperature of the storage chip 100 reaches the set threshold, the storage chip is activated; the temperature detected by the temperature detection module provides a reference for the activation and operation of the storage chip, thereby avoiding the activation and operation of the storage chip under low temperatures, shortening write time, and improving the writing stability of the storage chip.

When the storage chip 100 is in a low temperature environment, if the storage chip 100 is heated, then the temperature thereof increases quickly, thereby expediting the activation of the storage chip 100. Therefore, the control chip 120 according to the present invention can further be activated prior to the activation of the storage chip 100, and the control chip 120 heats the storage chip 100 by using heat generated itself after activation so as to raise the temperature of the storage chip 100 quickly.

After being activated, the control chip 120 controls the activation of the temperature detection unit 111 so as to detect the temperature of the storage chip 100. The temperature detection unit 111 can further transmit the detected temperature to the control chip 120 as the data for controlling the control chip 120.

The control chip 120 can judge whether a temperature detected by the temperature detection unit 111 reaches a set threshold, and control the activation of the storage chip 100 if the set threshold is reached.

If only one temperature detection unit 111 and one storage chip 100 are provided, and the one temperature detection unit 111 is configured to merely detect the temperature of one storage chip 100, when the control unit 120 judges that the temperature detected by this temperature detection unit 111 reaches a set threshold, then the control chip 120 controls the activation of this storage chip 100.

If one temperature detection unit 111 and a plurality of storage chips 100 are provided, and the one temperature detection unit 111 is configured to detect the temperatures of the plurality of storage chips 100, when the control unit 120 judges that the temperature detected by this temperature detection unit 111 reaches a set threshold, then the control chip 120 first controls the activation of the storage chip 100 closest to the control chip 120, and then controls the subsequent activations of other storage chips 100 above.

If a plurality of temperature detection units 111 and a plurality of storage chips 100 are provided, there may be the situation where one of the temperature detection units 111 detects one storage chip 100 only and one temperature detection unit 111 detects a plurality of the storage chips 100, or only the situation where one temperature detection unit 111 detects a plurality of the storage chips 100. When the control unit 120 judges that the temperature detected by a certain temperature detection unit 111 reaches a set threshold, the control chip 120 controls the activation of the storage chip 100 corresponding to this temperature detection unit 111, and if this temperature detection unit 111 detects the temperatures of a plurality of the storage chips 100, then the control chip 120 first controls the activation of the storage chip 100 closest to the control chip 120, and then controls the subsequent activations of other storage chips 100 above.

If a plurality of temperature detection units 111 and a plurality of storage chips 100 are provided, and the plurality of temperature detection units 111 are one-to-one corresponding to the plurality of storage chips 100, when the control unit 110 judges that the temperature detected by a certain temperature detection unit 111 reaches a set threshold, the control chip 120 controls the activation of the storage chip 100 corresponding to this temperature detection unit 111. Specifically, there are four storage chips 100 in the stack structure as shown in FIG. 1, each of the storage chips 100 has one temperature detection unit 111 correspondingly, and thus, each of the temperature detection units 111 detects the temperature of the corresponding storage chip 100, obtaining four detection values of temperature. The control chip 120 sequentially judges whether the temperatures detected by the four of the temperature detection units 111 reach a set threshold, and if a temperature detected by a certain temperature detection unit 111 reaches the set threshold, then the control chip 120 controls the activation of the storage chip corresponding to this temperature detection unit 111. For example, if the temperature detected by the temperature detection unit 111 in the storage chip 100 at the bottommost layer of the stack structure first reaches the set threshold, then the control chip 120 first controls the activation of the storage chip 100 at the bottommost layer of the stack structure; next, if the temperature detected by the corresponding temperature detection unit 111 in the storage chip 100 at the last but one layer of the stack structure also reaches the set threshold, the control unit 120 then controls the activation of the storage chip 100 at the last but one layer of the stack structure; the activation of the storage chips 100 at the two layers above are performed similarly.

For the semiconductor device having a plurality of storage chips 100, such aforementioned control structure and control manner further improve the precision of the activation timing of each storage chip 100, further reduce the write time when data is written to each storage chip 100 in a low temperature environment, and further improve the stability of writing to each storage chip 100.

When the semiconductor device according to the present invention operates in a low temperature environment, the temperature of the storage chip 100 can be raised to the set threshold by the control chip 120, preventing the increased resistances of the word line, bit line and metal connecting line (metal contacting portion) in the storage chip 100 due to the excessive low ambient temperature, thereby shortening the write time when data is written into the storage chip in a low temperature environment and improving the stability of writing to the storage chip. The set threshold may be set in the control chip 120, and the specific magnitude of the set threshold may be set as needed or based on experience.

In another embodiment, the control chip 120 may have an additional heating circuit (not depicted in the drawing) provided therein. The heating circuit is configured to heat the storage chip 100. Before or after the control chip 120 heats the storage chip 100, the control chip 120 judges whether a temperature of the storage chip 100 detected by the temperature detection unit 111 reaches a set threshold. If the set threshold is not reached, then the control chip controls the heating circuit to heat the storage chip 100; and if the set threshold is reached, then the control chip controls the heating circuit to stop heating the storage chip 100. Therefore, the accurate control of the heating process is realized such that the temperature of the storage chip 100 can be kept around the set threshold, preventing the excessive high or excessive low temperature of the storage chip 100, and thus, the write time to memory is always short.

The description above is merely the preferred implementations of the present invention. It should be noted that the ordinary skills in the art could further make several improvements and embellishments without departing the principle of the present invention, and these improvements and embellishments should also be considered as the scope sought for protection in the present invention.

The invention claimed is:

1. A semiconductor device, comprising a storage chip and a temperature detection module for detecting a temperature of the storage chip, wherein when the temperature detected by the temperature detection module reaches a set threshold, the storage chip is activated, and the temperature detection module comprises:
   a temperature detection unit configured to detect the temperature of the storage chip, and to output an analogue signal corresponding to the temperature; and
   an A/D conversion module having an input terminal and an output terminal, wherein the input terminal receives the analogue signal output by the temperature detection unit, the output terminal outputs a digital signal, and the A/D conversion module is configured to convert the analogue signal output by the temperature detection unit to the digital signal;
   wherein the temperature detection unit and the storage chip are powered by different power supplies, and the power supplied to the temperature detection unit is earlier than the power supplied to the storage chip.

2. The semiconductor device according to claim 1, wherein the temperature detection unit comprises: a fixed resistor having a first terminal and a second terminal, the first terminal being electrically connected to a first power supply; and
   a diode connected in series with the fixed resistor, a positive terminal of the diode being connected to the second terminal of the fixed resistor, and a negative terminal of the diode being electrically connected to a grounding terminal.

3. The semiconductor device according to claim 2, wherein the temperature detection unit further comprises a variable resistor connected in parallel with the diode.

4. The semiconductor device according to claim 1, wherein the temperature detection unit is disposed in the storage chip.

5. The semiconductor device according to claim 4, wherein the A/D conversion module is disposed in the storage chip.

6. The semiconductor device according to claim 4, wherein the temperature detection unit and the storage chip share the same grounding terminal.

7. A semiconductor device, comprising a storage chip and a temperature detection module for detecting a temperature of the storage chip, wherein when the temperature detected by the temperature detection module reaches a set threshold, the storage chip is activated, and the temperature detection module comprises:
   a temperature detection unit configured to detect the temperature of the storage chip, and to output an analogue signal corresponding to the temperature; and
   an A/D conversion module having an input terminal and an output terminal, wherein the input terminal receives the analogue signal output by the temperature detection unit, the output terminal outputs a digital signal, and the A/D conversion module is configured to convert the analogue signal output by the temperature detection unit to the digital signal;
   wherein the A/D conversion module comprises: a resistance unit having a first terminal and a second terminal, the first terminal of the resistance unit being electrically connected to a first power supply or a second power supply, the second terminal of the resistance unit being electrically connected to a grounding terminal, and the resistance unit having a plurality of leading-out terminals, each of the leading-out terminals having a different voltage; and
   a plurality of comparing units, a signal of the input terminal of the A/D conversion module being used as an input signal of the comparing units, signals of the plurality of leading-out terminals of the resistance unit being used as reference signals of the plurality of the comparing units respectively, and the comparing units outputting digital signals.

8. The semiconductor device according to claim 7, wherein the A/D conversion module further comprises an encoding unit receiving and encoding the digital signals output by the comparing units.

9. The semiconductor device according to claim 7, wherein the A/D conversion module further comprises an output unit that is connected to the comparing units and configured to output the digital signals.

10. The semiconductor device according to claim 7, wherein the resistance unit comprises a plurality of sub-resistors connected in series, wherein a quantity of the sub-resistors spaced between each of the leading-out terminals of the resistance unit and the second terminal of the resistance unit is different such that each of the leading-out terminals has a different voltage.

11. The semiconductor device according to claim 10, wherein resistance values of the sub-resistors are either same or different.

12. The semiconductor device according to claim 10, wherein the quantity of the sub-resistors spaced between each of the leading-out terminals of the resistance unit and the second terminal of the resistance unit increments by a preset numerical value.

13. The semiconductor device according to claim 10, wherein one or more storage chips are provided, and in the case of a plurality of the storage chips, several of the storage chips are sequentially stacked upwardly; and when a plurality of the storage chips is provided, the storage chips are electrically connected to the grounding terminal and the second power supply with a through-silicon-via structure.

14. The semiconductor device according to claim 13, wherein the temperature detection unit is electrically connected to the first power supply with a through-silicon-via structure.

15. The semiconductor device according to claim 13, wherein one or more temperature detection units are provided, and the one or more temperature detection units are one-to-one corresponding to the one or more storage chips.

16. A semiconductor device, comprising a storage chip and a temperature detection module for detecting a temperature of the storage chip, wherein when the temperature detected by the temperature detection module reaches a set threshold, the storage chip is activated, and the temperature detection module comprises:

a temperature detection unit configured to detect the temperature of the storage chip, and to output an analogue signal corresponding to the temperature; and an A/D conversion module having an input terminal and an output terminal, wherein the input terminal receives the analogue signal output by the temperature detection unit, the output terminal outputs a digital signal, and the A/D conversion module is configured to convert the analogue signal output by the temperature detection unit to the digital signal;

wherein the semiconductor device further comprises a control chip, the storage chip and the temperature detection unit being electrically connected to the control chip, and the storage chip being disposed on the control chip.

17. The semiconductor device according to claim 16, wherein the semiconductor device further comprises a wiring substrate having connection lines provided therein, both of the storage chip and the control chip being locating on the wiring substrate, and the storage chip and the control chip being electrically connected through the connection lines in the wiring substrate.

18. The semiconductor device according to claim 16, wherein the control chip is configured to heat the storage chip prior to the activation of the storage chip, to judge whether a temperature detected by the temperature detection unit reaches the set threshold, and to control the activation of the storage chip if the set threshold is reached.

* * * * *